United States Patent [19]

Fukuda et al.

[11] 4,376,888
[45] Mar. 15, 1983

[54] PHOTOELECTRIC CONVERSION TYPE INFORMATION PROCESSING DEVICE

[75] Inventors: Tadaji Fukuda, Kawasaki; Takashi Nakagiri, Tokyo, both of Japan

[73] Assignee: Canon Kabushiki Kaisha, Tokyo, Japan

[21] Appl. No.: 324,448

[22] Filed: Nov. 24, 1981

Related U.S. Application Data

[63] Continuation of Ser. No. 31,587, Apr. 19, 1979, abandoned.

[30] Foreign Application Priority Data

Apr. 20, 1978 [JP] Japan .................................. 53-47097
Apr. 20, 1978 [JP] Japan .................................. 53-47098

[51] Int. Cl.³ ............................................ H01J 40/14
[52] U.S. Cl. ................................ 250/211 J; 250/578
[58] Field of Search ............... 250/211 R, 211 J, 578; 357/30, 31, 32; 358/211, 212, 213

[56] References Cited

U.S. PATENT DOCUMENTS 3,717,770 2/1973 Dyck et al. ..................... 250/211 J
3,801,820 4/1974 Eichelberger et al. .......... 250/211 J
3,814,846 6/1974 Snow ............................... 250/211 J

*Primary Examiner*—David C. Nelms
*Attorney, Agent, or Firm*—Fitzpatrick, Cella, Harper & Scinto

[57] ABSTRACT

A photoelectric conversion type information processing device constructed with a photoelectric conversion section including a plurality of photoelectric conversion elements arranged in an array or in a matrix form, a common electrode for the photoelectric conversion elements, independent electrodes for each of the photoelectric conversion elements, and a photoelectric conversion layer interposed between the common electrode and the independent electrode; and a time-sequential signal conversion section for introducing thereinto in parallel, in response to a light signal input, a plurality of signal outputs from the photoelectric conversion elements and rendering the signal as introduced to be a time-sequential output.

30 Claims, 21 Drawing Figures

PHOTOELECTRIC CONVERSION TYPE INFORMATION PROCESSING DEVICE

This is a continuation of application Ser. No. 31,587, filed Apr. 19, 1979, now abandoned.

BACKGROUND OF THE INVENTION

1. Field of the Invention

This invention relates to a photo-electric conversion device having a photo-electric conversion section.

2. Description of Prior Arts

The photoelectric conversion type information processing device having a solid state photoelectric conversion section is applicable to a television image pick-up device, an input device for facsimile, digital copier, or other reading devices for characters, picture images, etc., the development of which has progressed remarkably in recent years.

Such photoelectric conversion type information processing device includes a group of image elements having a photoelectric conversion function, and a circuit having a scanning function to take out an electric signal output from the image element group in the form of a time sequential arrangement. For such information processing device, there are various types such as one including a photo-diode and MOS FET (Metal Oxide Semiconductor—Field Effect Transistor (hereinafter abbreviated as "MOS type")) as constituent elements, or one including the so-called CTD (Charge Transfer Device) such as CCD (Charge Coupled Device) and BBD (Bucket Brigade Device), and so on as the constituent elements.

However, since the MOS type and CTD use a mono crystalline silicon wafer (hereinafter abbreviated as "C-Si") as the substrate, the area of the light receiving surface of the photoelectric conversion section is inevitably restricted by the size of the C-Si wafer. In other words, at the present stage, it is only possible to manufacture the C-Si wafer having a size of a few inches or so at best in consideration of uniformity in the entire region of such wafer. On account of this, the light receiving surface of the photoelectric conversion element cannot be larger than the size of the C-Si substrate in the photoelectric conversion type information processing device using such C-Si wafer and including MOS type or CTD as its constituent element.

Accordingly, when the information processing device having the photoelectric conversion section, the light receiving surface of which has such limited area, is used as the input device for the digital copier, for example, it is inevitably necessary that an optical system having a large image reduction ratio be interposed between an image original to be reproduced and the light receiving surface so that an optical image of the image original may be formed on the light receiving surface through the optical system. In this case, however, there exist technical restrictions against increase in image resolution to be described in the following.

When an image original in A4 size is to be reproduced with the photoelectric conversion section having its image resolution of, for example, 10 lines/mm and a length of the light receiving surface in the longitudinal direction of 3 cm, the optical image of the image original to be focussed on the light receiving surface is reduced to about 1/6.9 with the consequence that the substantial image resolution of the photoelectric conversion section to the A4 size image original reduces to about 1.5 lines/mm. Thus, the substantial image resolution of the photoelectric conversion section lowers at a rate of (size of the light receiving surface)/(size of the image original) according as the size of the image original to be reproduced becomes larger.

In order, therefore, to solve this problem in this type of information processing device, there is required a manufacturing technique for increasing the image resolution of the photoelectric conversion section. However, for such high resolution to be obtained with such limited small area, the manufacture of the photoelectric conversion section should be so conducted that its integration density may be made extremely high and its structural elements may be free from any defect. Such manufacturing technique, however, has its own limitation.

On the other hand, there has been proposed a new system, in which a plurality of photoelectric conversion sections are arranged in such a manner that the length of the entire light receiving surface in its lengthwise direction and the length in the scanning direction of the maximum size of the image original to be reproduced may be in a one-to-one relationship, and that the optical image of the image original focussed on the light receiving surface is divided into small fractions corresponding to the number of the photoelectric conversion sections, thereby preventing substantial lowering of the image resolution.

Even such system, however, has some inconveniences to be described as follows. That is, when a plurality of photoelectric conversion sections are arranged, there inevitably occur those boundary regions where no light receiving surfaces are present between adjacent photoelectric conversion sections, as the result of which the light receiving surfaces are lacking in continuity, when viewed generally, and the optical image of the image original to be focussed is split, and the portions of the image original at these boundary regions are not forwarded to the photoelectric conversion section as the input signal. In this consequence, the reproduced image has such incompleteness in its image-formation that it includes whitened lines in some parts thereof, or the image portions where those white lines to be formed are removed and the entire portions are joined together. Also, the optical image which has been focussed on the plurality of light receiving surfaces in division is an optically reversed image on each of the light receiving surfaces, so that the overall image differs from the optically reversed image of the image original. Accordingly, reproduction of the optical image focussed on the light receiving surface, as it does not lead to reproduction of the image original.

Thus, it is extremely difficult with the photoelectric conversion type information processing device provided with the photoelectric conversion sections to reproduce informations with high resolution, since its light receiving surface is small in area. It has therefore been desired to have such information processing device provided with the photoelectric conversion section having the light receiving surface of a sufficiently large area which does not necessitate size-reduction in the image original and having excellent image resolution. In particular, for the input device facsimiles and digital copiers, or the reading device for characters and images on the image original, the photoelectric conversion type information processing device should be indispensably provided with photoelectric conversion sections having a light receiving surface equal in size to the image original for reproduction and being capable of faithfully reproducing the image original without lowering the image resolution required of the image as reproduced.

SUMMARY OF THE INVENTION

In view of the afore-described various problems inherent in the known information processing device, it is the primary object of the present invention to provide a photoelectric conversion type information processing device provided with a photoelectric conversion section having a sufficiently lengthened light receiving surface, a high image resolution, a high sensitivity, and a light weight.

It is another object of the present invention to provide a photoelectric conversion type information processing device provided with a photoelectric conversion section having a light receiving surface of a large area, a high image resolution, and a high sensitivity.

According to the present invention, in one aspect thereof, there is provided a photoelectric conversion type information processing device comprising: a single-dimensional, elongated photoelectric conversion section having n numbers of photoelectric conversion elements arranged in an array, a common electrode for said n numbers of photoelectric conversion elements, n numbers of electrodes independently provided for each of said n numbers of photoelectric conversion elements, and a photoelectric conversion layer interposed between said common electrode and said individual electrodes; and a time-sequential signal conversion section which, in response to a light signal input, introduces thereinto in parallel k numbers ($n \geq k$) of signal outputs from said n numbers of photoelectric conversion elements, and which serially converts for output these introduced input signal groups, or divides such signal group into a plurality of blocks to serially convert each block for output therefrom.

According to the present invention, in another aspect thereof, there is provided a photoelectric conversion type information processing device comprising: a two-dimensional photoelectric conversion section having a group of m×n numbers of photoelectric conversion elements arranged in a matrix form consisting of m rows and n columns, an electrode (x electrode) common to each row of said photoelectric conversion elements, an electrode (y electrode) common to each column of said photoelectric conversion elements, and a photoelectric conversion layer interposed between said two electrodes X and Y; a row-selection signal generating section which generates a signal output as the result of selection of any row in said two-dimensional photoelectric conversion section; and a time-sequential signal conversion section which, in response to a light signal input, introduces thereinto in parallel a group of k numbers ($n \geq k$) of signal output from each of said n numbers of photoelectric conversion elements constituting the row to be selected, and which serially converts for output these parallelly introduced input signal group, or divides said parallelly introduced input signal group into a plurality of blocks to be a serial output for each block.

The foregoing objects, other objects as well as the specific construction and function of the photoelectric conversion type information processing device according to the present invention will become more apparent and clearly understandable from the following detailed explanations thereof, when read in connection with the accompanying drawings.

DETAILED DESCRIPTION OF PREFERRED EMBODIMENTS

Figure 1:
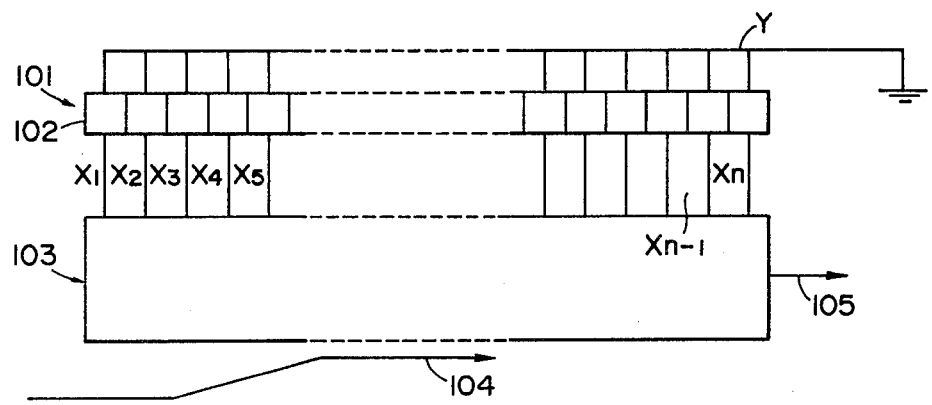
FIGS. 1, 2, 3, 4, 5 and 6 are block diagrams for explanation of various preferred embodiments of the photoelectric conversion type information processing device according to the present invention.

Referring to FIG. 1 which is a block diagram for explaining one embodiment of a principal structural part of the photoelectric conversion type information processing device according to the present invention, a reference numeral 101 designates a single-dimensional, elongated photoelectric conversion section, wherein n numbers of photoelectric conversion elements 102 are arranged in an array. While the structural details of the photoelectric conversion elements 102 will be described later, they have n numbers of electrodes ($X_1, X_2, \ldots X_{n-1}, X_n$) provided independently for each of the photoelectric conversion elements, a common electrode (Y) for the n numbers of the photoelectric conversion elements, and a photoelectric conversion layer between the independent electrodes and the common electrode.

The photoelectric conversion layer to form the photoelectric conversion element 102 may be provided independently for each element, of may be provided continuously without being split for each element. Which type should be chosen depends on the material constituting the photoelectric conversion layer. For example, when the photoelectric conversion layer is of a photovoltaic type, it is preferable that it be formed separately for each element. In the case of it being a photo-conductive type, the layer may either be separate or continuous.

Irradiation of the light signal onto the light receiving surface of the single dimensional, elongated photo-electric conversion section 101 may be carried out directly, or indirectly through an appropriate optical system to focus an image on the light receiving surface thereof.

A reference nuneral 103 designates a time-sequential signal conversion section having a function of introducing thereinto in parallel n numbers of electric signal outputs through n numbers of independent electrodes in response to light signal input into the single dimensional, elongated photoelectric conversion section 101, and of producing the thus parallel introduced n numbers of electrical signals as serial output signals 105 by the instruction of a transfer signal (shift pulse) 104. In other words, by introducing n numbers of the transfer signal 104 as an input into the time-sequential signal conversion section 103, the parallel input signals from the signal dimensional, elongated photoelectric conversion section 101 into the time-sequential signal conversion section 103 are rendered time-sequential and totally produced as the output signal 105.

In the present invention, since the single dimensional, elongated photoelectric conversion section 101 is formed by thin film precision technique, separate from the time-sequential signal conversion section 103, it can be formed in a long length, unlike the so-called "CCD photo-sensor" using a silicon wafer. It can be elongated as long as the width of A3 size image original. Consequently, direct reading of the image original becomes possible by a contact system without using an optical system for size-reduction, hence the overall size of the device can be reduced as compact as possible, and its weight can also be reduced.

The time-sequential signal conversion section 103 can be formed as small in area as possible, in contrast to the single dimensional, elongated photoelectric conversion section 101, only if it has a desired conversion function. It should be noted that the single dimensional, elongated photoelectric conversion section 101 and the time-sequential signal conversion section 103 may be provided on one and the same substrate, or on a separate substrate for each of them. For easiness of wiring, however, the two conversion sections may preferably be provided on one and the same substrate. It should also be noted that the single dimensional, elongated photoelectric conversion section 101 can be provided on one surface side of one and the same substrate, and the time-sequential signal conversion section 103 on the other surface side thereof. When the single dimensional, elongated photoelectric conversion section 101 and the time-sequential signal conversion section 103 are manufactured separately, the electrical wiring connection between them may be carried out by, for example, wire-bonding.

The time-sequential signal conversion section 103 according to the present invention is constructed with various signal conversion means such as, for example, CCD register (CCDR), BBD register (BBDR), shift register (SR), switching transistor array (STA), data selector (DS), and so forth.

FIGS. 2 to 5 illustrate circuit diagrams, wherein the time-sequential signal conversion section is constructed with the abovementioned various signal conversion means.

Figure 2:
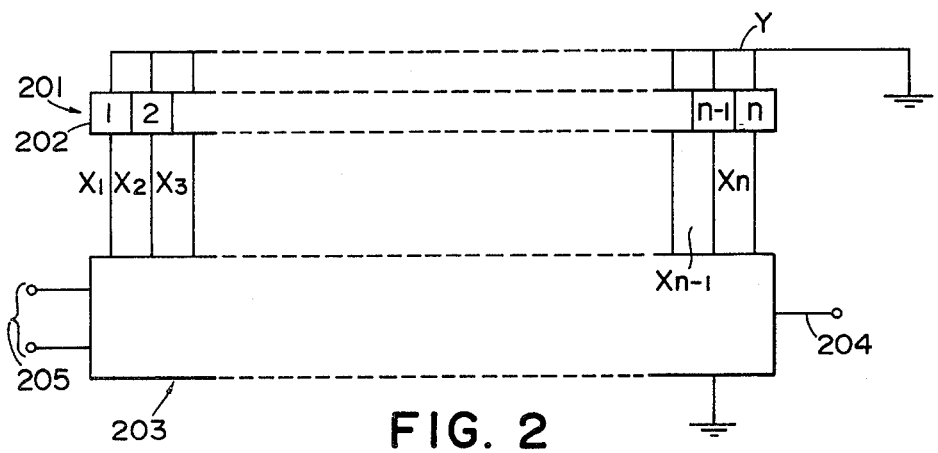

FIG. 2 illustrates one embodiment, in which CCDR is employed as the time-sequential signal conversion section 203. The CCDR has a function of accumulating input signals in parallel introduced therein for each photo-electric conversion element 202 constituting the single-dimensional, elongated photoelectric conversion section 201, rendering the abovementioned input signal group time-sequential in accordance with instruction of a transfer signal input from a transfer electrode 205, and transferring the thus obtained time-sequential signals.

The CCDR having such function is required to be used in a plurality of numbers, when the number of the photoelectric conversion element 202 is larger than the number of the source (input terminal) of the CCDR. In this instance, it is necessary to take a timing in such a manner that the time-sequential signal output from each of the time-sequential signal conversion sections may be produced as an output with a desired time-sequence in its entirety. This point holds good with the case of FIG. 3 to be described hereinbelow.

Figure 3:
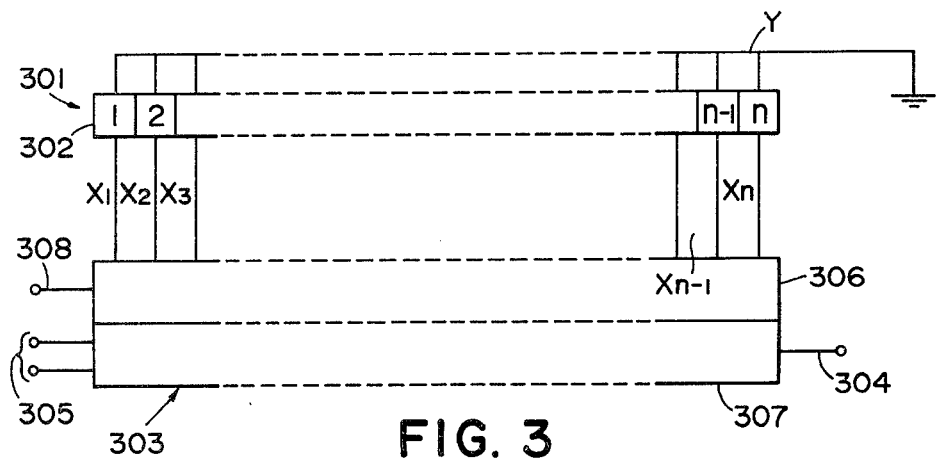

FIG. 3 illustrates a similar construction as that in FIG. 2. A point of difference between the two constructions resides in that the time-sequential signal conversion section 303 is functionally divided into an accumulating section 306 and a transferring section 307. As the consequence, there acrues an advantage such that a quantity of accommodation for informations per unit time can be increased, i.e., while the signals accumulated in the accumulating section 306 are being transferred to the transfer section 307, other signals can be accumulated in this accumulating section 306. In the illustration, a numeral 308 refers to an input gate terminal.

Figure 4:
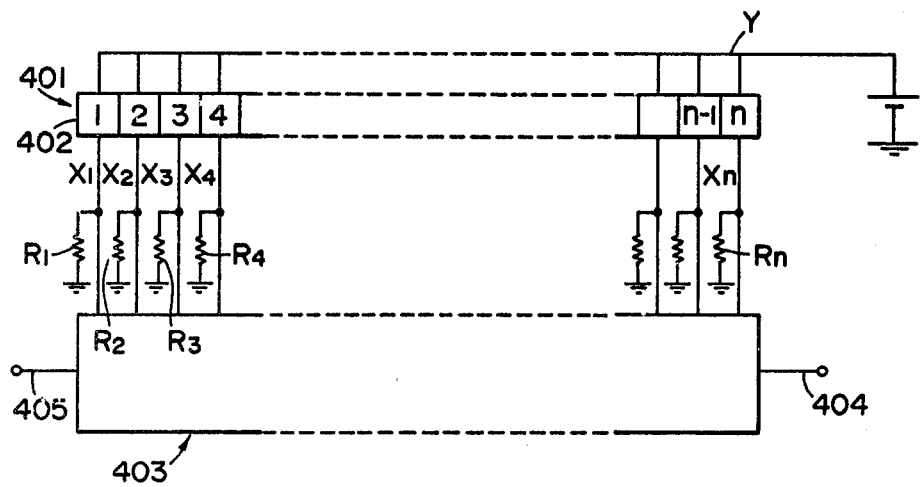

FIG. 4 illustrates a case, in which SR is adopted as the time-sequential signal conversion section 403. In this construction, a group of input signals introduced in parallel thereinto from the single-dimensional, elongated photoelectric conversion section 401 is produced as an output from an output terminal 404 in a time-sequential manner by the transfer signal input from a transfer electrode terminal 405.

Figure 5:
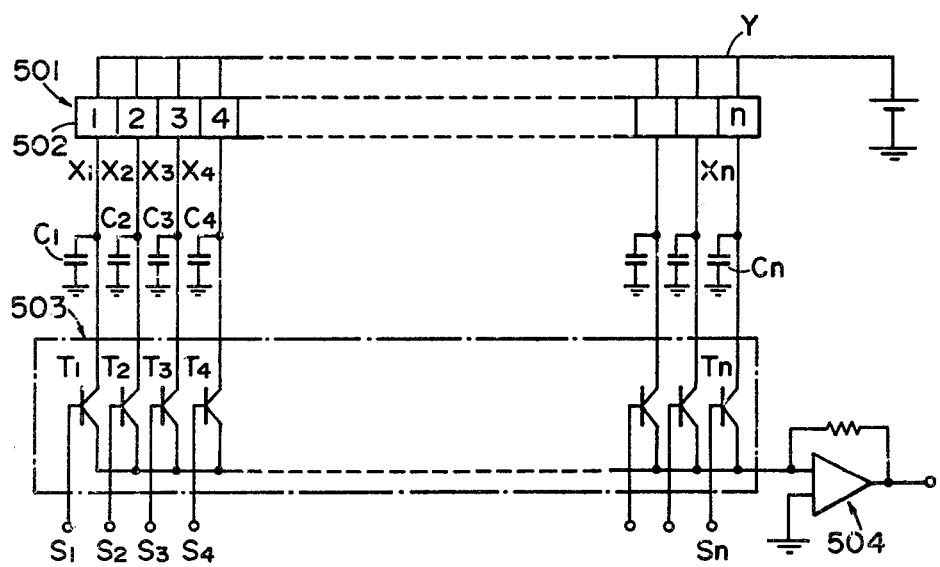

FIG. 5 illustrates a case, in which STA is employed as the time-sequential signal conversion section 503. According to this construction of the device, electrical signals which are in parallel introduced thereinto from the single-dimensional, elongated photoelectric conversion section 501 are rendered time-sequential for output by a series of switching operations effected by n numbers of switching transistors (ST). The output signals from STA may be amplified by providing an amplifier 504 as shown in the drawing.

For the n numbers of ST ($T_1, T_2, \ldots T_{n-1}, T_n$) constituting STA to effect the switching operations in sequence, it may be sufficient that switching electrodes $S_1, S_2, \ldots S_n$ be wire-connected with ring-counters constructed with SR, and output signals from the ring counters may be introduced in sequence as the input into each of the switching electrodes $S_1, S_2, \ldots S_n$.

Figure 6:
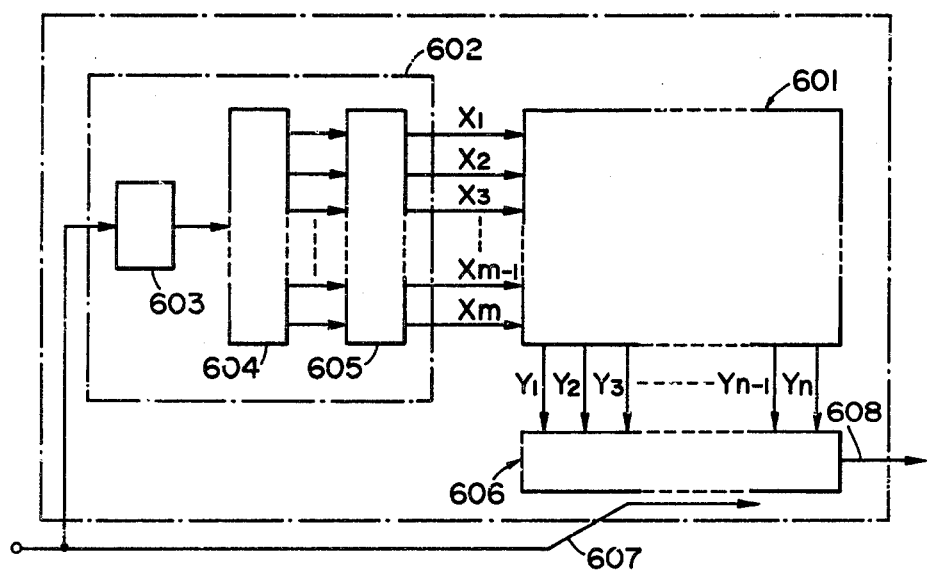

FIG. 6 is a block diagram for explaining the principal construction of another preferred embodiment of the photoelectric conversion type information processing device according to the present invention.

In the drawing, a reference numeral 602 designates a two-dimensional photoelectric conversion section, wherein m×n numbers of photoelectric conversion elements in group are arranged in a matrix form with m number and n numbers of columns. While the detailed construction of the photoelectric conversion element will be described later, it has a single electrode ($X_1, X_2, \ldots X_{n-1}, X_n$) common to each of n numbers of the photoelectric conversion elements constituting one row, an electrode ($Y_1, Y_2, Y_3, \ldots Y_{n-1}, Y_n$) common to each of m numbers of the photo-electric conversion elements constituting one column, and a photoelectric conversion layer interposed between the two common electrodes. The photo-electric conversion layer constituting the photo-electric conversion element may be provided independently for each element, or continuously without being split for each element, as is the case with the construction shown in FIG. 1.

A reference numeral 602 designates a row selection signal generating section which generates a signal output as the result of selection of an electrode designated from among the group of X electrodes constituting the rows in the two-dimensional photoelectric conversion section 601. This two-dimensional photoelectric conversion section 601 includes a counter 603, a switching signal generating circuit 604, and a switch (SW) circuit 605. The switching signal generating circuit 604 is constructed, for example, with a ring counter which is made up of SR. The SW circuit 605 is constructed with an electronic or mechanical device having a switching function, in number corresponding to the number of the X electrodes, i.e., m numbers. This SW circuit performs its switching operations in sequence in accordance with signals which are sequentially generated in the switching signal generating circuit 604. For instance, when the $X_1$ electrode is selected, the switching element connected with the $X_1$ electrode performs the switching operation.

A numeral 606 refers to the time-sequential signal conversion section having functions of introducing thereinto in parallel, as inputs the electrical signal outputs for every row in response to the light signal input into the two-dimensional photoelectric conversion section 601, and of producing the thus introduced electric signal input as the serial signal output 608 in accordance with instructions by the transfer signal (shift pulse) 607. In other words, by introduction of n numbers of the transfer signal input 607 into the time-sequential signal conversion section 606, the entire parallel input signals into the time-sequential signal conversion section 606 from the two-dimensional photoelectric conversion section 601 are produced as the outputs. On the other hand, when n numbers of signal inputs are introduced into a counter 603 in correspondence to the abovementioned transfer signal 607, it produces a single output signal. Subsequently, the output signal from the counter is introduced as an input into the switching signal generating circuit 604, from which circuit 604 a signal output to select the row in the two-dimensional photoelectric conversion section 601 is generated, whereby one of the switching elements constituting the SW circuit 605 is actuated.

Since the two-dimensional, elongated photoelectric conversion section 601 is separated from the time-sequential signal conversion section 606, and is formed by means of the thin film precision technique, it can be enlarged in its area, different from the so-called ordinary CCD photosensor. It is usually possible to enlarge its area as wide as the breadth of an image original in A3 size. Accordingly, direct reading of the image original is possible by the contact system without necessity for use of an optical system for size reduction, whereby the device itself can be made small in size and light in weight.

The time-sequential signal conversion section 606, contrary to the two-dimensional photoelectric conversion section 601, can be formed in as small an area as possible, provided that it should possess a desired conversion function. It should also be noted that both two-dimensional photoelectric conversion section 601 and the time-sequential signal conversion switch 606 may be provided on one and the same substrate, or they may be provided on a separate substrate for each of them. From the standpoint of easiness in wiring, however, they should preferably be provided on one and the same substrate. It should further be noted that the two-dimensional photoelectric conversion section 601 can be provided on one surface side of the same substrate, and the time-sequential signal conversion section 606 on the other surface side thereof. The time sequential signal conversion section 606 is constructed with the signal conversion means of the types as mentioned with respect to FIG. 1.

In the following, explanations will be given as to the photoelectric conversion element constituting the photoelectric conversion section according to the present invention.

Figure 7:
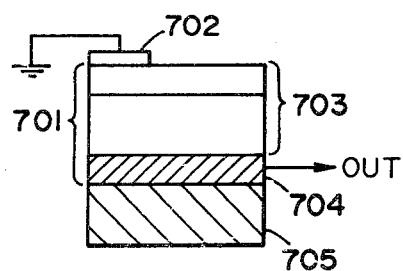
FIGS. 7, 8 and 9 are respectively schematic structural diagrams in cross-section for explanation of the basic construction of the photoelectric conversion elements in the photoelectric conversion section which is the principal part of the photoelectric conversion type information processing device according to the present invention.
Figure 8:
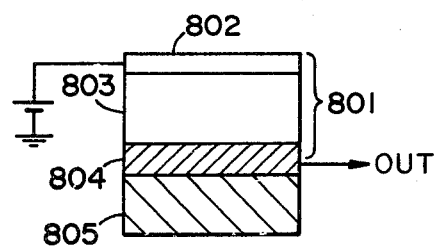
Figure 9:
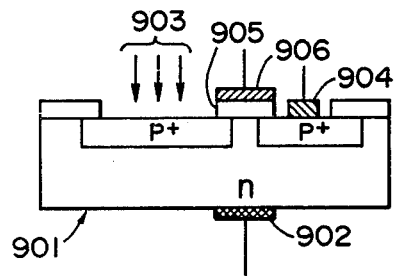

FIGS. 7 to 9 are respectively schematic structural diagrams in cross-section for explanation of the basic construction of the photoelectric conversion element constituting the photoelectric conversion section.

For the photoelectric conversion element constituting the photoelectric conversion section, there may be enumerated the following types.

(A) Photovoltaic Type (a) pn-junction type
(b) Schottky barrier type (B) Photo-conductive Type (c) photo-diode type
(d) mono-layer type (C) Other Types (e) MOS (Metal Oxide Semiconductor) type Of these various types of the photoelectric conversion element, the type (a) is particularly effective for the purpose of the present invention from the standpoint of its advantage to be described later.

FIG. 7 is a schematic structural diagram in cross-section showing the basic construction of the photoelectric conversion element belonging to the abovementioned type (a). The photoelectric conversion element 701 shown in FIG. 7 is composed of a row electrode 702, a column electrode 704, and a photovoltaic layer 703 between these electrodes 702 and 704. In the illustration, the photovoltaic layer 703 is of such a construction that a p-type semiconductor layer is formed to the side of the row electrode 702 and an n-type semiconductor layer is formed to the side of the column electrode 704, thereby building up a p-n junction. Needless to say, the sequence of lamination of the p- and n-type semiconductor layers may be opposite that of the illustrated structure. Also the p-n junction to be formed in the layer 703 may be either a homo-junction or a hetero-junction. For the material to form the homo-junction, there may be enumerated, for example, amorphous silicon (a-Si) amorphous germanium (a-Ge), and so forth. The photovoltaic layer 703 is formed using these materials and by the so-called physical vapor deposition method (PVD) such as, for example, vacuum evaporation method, glow discharge method, sputtering method, ion plating method, and so on.

For the formation of the hetero-junction, the same method as used in forming the homo-junction can be adopted. In this case, it is preferable that appropriate selection be made out of the p-type material and the n-type material so that the photovoltaic layer 703 as formed may exhibit desired characteristics.

For the p-type semiconductive material, there may be enumerated, for example, various substances such as Se, $Se_{1-x}As_x$, SeTe, PbO, $Sb_2S_3$, ZnCdTe, $CdSeO_3$, a-Si doped with B and the like, and so on. For the n-type semiconductive material, there may be enumerated, for example, various substances such as Se, CdS, PbO, $Sb_2S_3$, ZnSe, CdSe, $In_2O_3$, $SnO_2$ a-Si doped with P and the like, and so on.

The row electrode 702 and the column electrode 704 are formed of materials to form an ohmic contact with the photovoltaic layer 703. Such materials to form the ohmic contact with the photovoltaic layer 703 may vary depending on the material forming the photovoltaic layer 703. As an example, when the p-n junction is formed of the a-Si as illustrated, Pt, Ir, Au, Pd, Al, Mo, polycrystalline Si (poly-Si), Nb, Ta, V, Ti, Cr, stainless steel, etc. are used as the electrode material for the p-type a-Si layer, and Al, Mo, poly-Si, Nb, Ta, V, Ti, Cr, stainless steel, and so on are adopted as the electrode material for the n-type a-Si layer.

Further, as shown in the drawing, when a light beam is irradiated from the side of the row electrode 702, it is preferable that the p-type layer to be irradiated by the light beam may be formed as thin as possible so that maximum possible amount of light irradiation may reach the p-n junction. On the contrary, when the irradiation is effected from the side of the substrate 705, the n-type layer may preferably be made thin for the same reason as mentioned above. In this instance, the column electrode 704 should, of course, be transmissive to irradiating light.

In the case the photoelectric conversion element is to be the photovoltaic type, there may be used, besides the p-n junction type, the Shottky barrier type between the photovoltaic layer 703 and the row electrode 702 or the column electrode 704 (vide: the abovementioned classification (A)-(B) for the photoelectric conversion element). In this case, the row electrode 702 or the column electrode 704 is made of a material forming the Schottky barrier with the photovoltaic layer 703. In more detail, when the layer 703 is made of the n-type a-Si, the material for the electrodes may be selected from, for example, Pt, Ir, Au, Pd, and so on.

The photoelectric conversion element 801 shown in FIG. 8 is of the photoconductive type, and has such a construction that the column electrode 804 is provided on the substrate 805, the photoelectric conversion layer 803 exhibiting the photo-conductive property is provided on the column electrode 804, and the row electrode 802 is placed on the photoelectric conversion layer 803.

While the photoelectric conversion layer 803 exhibiting the photoconductive property may be formed of various kinds of photoconductive material which have generally been know, selection should be so made that the thin film forming technique may be applied thereto. Such suitable material may be, for example, a-Si, a-Ge, CdS, Se, compounds of Se, and others.

The electrodes 802 and 804 are made of materials forming an ohmic contact with the photoelectric conversion layer 803. The materials for the electrodes are selected from, for example, Pt, Ir, Au, Pd, Al, Mo, poly-Si, Nb, Ta, V, Ti, Cr, stainless steel, etc., in case the photoelectric conversion layer 803 is formed of the p-type a-Si. When the n-type a-Si is used for forming the photoelectric conversion element 803, there may be used, for example, Al, Mo, poly-Si, Nb, Ta, V, Ti, Cr, stainless steel, etc. for the electrodes.

While the photoelectric conversion layer 803 is formed of the p-type or n-type photoconductive materials, as mentioned above, it may be constructed with these p- and n-type photo-conductive materials in a laminated layer (vide: the abovementioned classification (C)). The electrode 802 should preferably be split into two portions at both ends of the photoelectric conversion layer 803 with its center part being open so that irradiation light beam may directly enter the layer 803. Such structure is particularly significant in that, when the light beam is irradiated from the side of the electrode 802, light absorption by the electrode 802 can be avoided.

FIG. 9 is the schematic structural diagram in cross-section showing the basic construction of the abovementioned classified type (C)-(e) for the photoelectric conversion element, which takes the so-called MOS type photosensitive element structure. As shown in the drawing, when the photoelectric conversion element 901 at the side of the electrode 902 is of the n-type, the element 901 is of $p^+$ type at its portions where light beam 903 is projected and where a drain electrode (column electrode) 904 is provided, while its portion where the gate electrode (row electrode) 906 is provided through the insulating layer 905, is formed in the n-type. For the materials which form the photoelectric conversion element 901 of such MOS type photo-sensitive element construction, there may be enumerated, for example, a-Si, etc. capable of performing the p,n control. In the illustration, the side of the electrode 902 is shown to be of the n-type. When the side is of the p-type, the $p^+$ type portion in the illustration is of the $n^+$ type.

Figure 10:
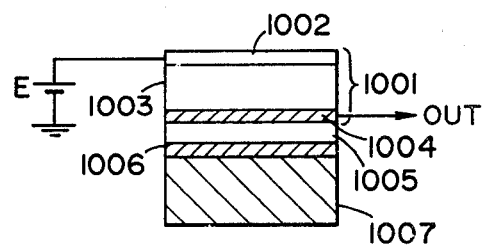
FIGS. 10, 11, 12, 13 and 14 are respectively schematic structural diagrams in cross-section for explanation of modified embodiments of the photoelectric conversion elements for the information processing device according to the present invention, which is a composite type coupled with other functional elements.
Figure 11:
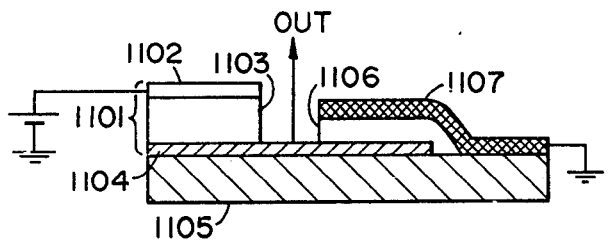

The embodiments shown in FIGS. 10 and 11 are of such construction that electrically insulative layer 1005 (or 1106) is provided beneath an independent electrode 1004 (or 1104).

In the embodiment of FIG. 10, the insulative layer 1005 made of an electrically insulative material such as, for example, $SiO_2$ is provided beneath the independent electrode 1004 of the photoelectric conversion element 1001, and another electrode 1006 is provided beneath the insulative layer 1005 as the opposite electrode to the electrode 1004. The electrode 1004, the insulative layer 1005, and the electrode 1006 form a capacitor, which are in turn laminated on the substrate 1007 as an integral part thereof. When light is irradiated onto the photoelectric conversion layer 1003, an electric signal output is produced from the independent electrode 1004 as shown in the drawing.

In the case of the FIG. 10 embodiment, the insulating layer 1005 is provided on the surface of the independent electrode 1004 opposite to the surface where the photoelectric conversion layer 1003 is provided. In the case of the FIG. 11 embodiment, however, the insulating layer 1106 is provided on the same surface side of the independent electrode 1104 as that where the photoelectric conversion layer 1103 is provided. A reference numeral 1107 designates an electrode provided in confrontation to the electrode 1104 through the insulating layer 1106. In this case, too, the electrode 1104, the insulating layer 1106, and the electrode 1107 constitute a capacitor as is the case with the FIG. 10 embodiment. An electrical signal output from the photoelectric conversion layer 1103 is taken out of the intermediate portion between the photoelectric conversion layer 1103 and the insulating layer 1106.

Figure 12:
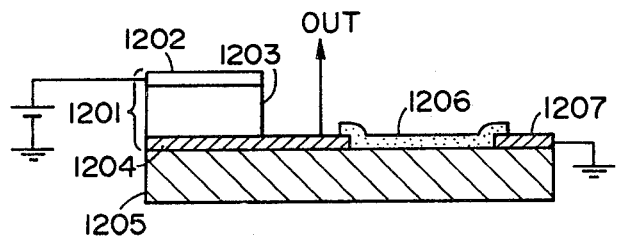

In the case of the FIG. 12 embodiment, a resistance layer 1206 is provided on the surface side of the substrate 1205 where the independent electrode 1204 is provided, in direct connection with the electrode 1204, as shown in the drawing. An electrical signal output from the photoelectric conversion layer 1201 is taken out of a part of the independent electrode 1204 between the photoelectric conversion layer 1201 and the resistance layer 1206.

Figure 13:
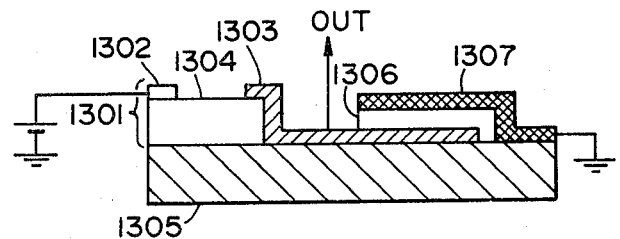
Figure 14:
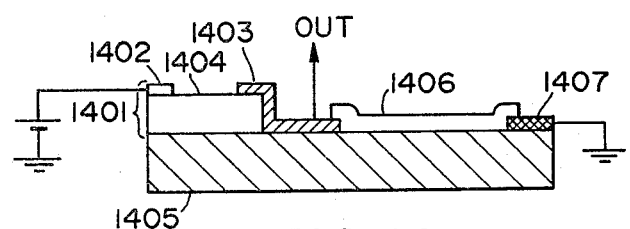

In the case of the FIGS. 13 and 14 embodiments, the common electrode and the independent electrode are provided on the same surface side of the photoelectric conversion layer, and the insulating layer or the resistance layer is provided in direct connection with the independent electrode.

In more detail, the FIG. 13 embodiment is of such construction that the independent electrode 1303 for taking out an electrical signal output from the photoelectric conversion layer 1304 of the photoelectric conversion element 1301 is provided on the same surface side where the common electrode 1302 of the photoelectric conversion layer 1304 is provided, and that the insulating layer 1306 is provided on the independent electrode 1303. A reference numeral 307 designates an opposite electrode to the independent electrode 1306. These electrode 1303, the insulating layer 1306, and the electrode 1307 constitute a capacitor. A numeral 1305 refers to the substrate.

In the case of the FIG. 14 embodiment, the resistance layer 1406 is provided in direct connection with the independent electrode 1403, in place of the insulating layer 1306 in the FIG. 13 embodiment. This embodiment is not essentially different from the embodiment of FIG. 12 with the exception that both common electrode 1402 and independent electrode 1403 are provided on the same surface side of the photoelectric conversion layer 1404. A numeral 1407 refers to an electrode provided in confrontation to the independent electrode 1403 through the resistance layer 1406.

So far, explanations have been given, in reference to FIGS. 10 to 14, as to the composite type of the photoelectric conversion element of the photoconductive type, wherein a capacitor or a resistor is connected as the other element. The characteristics of such composite type of the photoelectric conversion element may be summarized as follows.

The type of the photoelectric conversion element, wherein the resistor is connected to the photoelectric conversion element is represented by the circuit diagram in FIG. 4. According to this construction, electrical signal forwarded from each of the photoelectric conversion elements can be introduced as input into the time-sequential signal conversion section 403 with a stable voltage, whereby slight fluctuations in the performance of each photoelectric conversion element can be smoothed out. On the other hand, the type of the photoelectric conversion element, wherein the capacitor is connected with the element is represented by the circuit diagram as shown in FIG. 5. According to this construction, the electrical signal input from each of the photoelectric conversion elements into the time-sequential signal conversion section 503 can be once accumulated in the capacitor as a charge quantity, and then this charge quantity can be introduced into the time-sequential signal conversion section 503 as an input signal thereto. On account of this, the input signal into the conversion section 503 can be analogized to increase the signal current thereof.

For the materials to form the photoelectric conversion layer according to the present invention, those as mentioned in the foregoing may be used. In particular, since a-Si has more excellent characteristics to be described than those of other materials, it is possible to provide the photoelectric conversion section of superior quality, if all or a part of the photoelectric conversion layer is made of a-Si.

The characteristics of a-Si are such that, in spite of its being amorphous, it can perform p and n control, has sensitivity over substantially the entire region of visible light, has high photo-sensitivity, has a large light absorption coefficient, is expensive enough for manufacture of the photoelectric conversion section having a large light receiving surface, because it is amorphous and hence not subjected to restriction in the size of the light receiving surface of the photoelectric conversion section to be formed, does not cause any public hazard, or pollution, and so on. Therefore, the material is extremely ideal and effective for attaining the purpose of the present invention.

Figure 15:
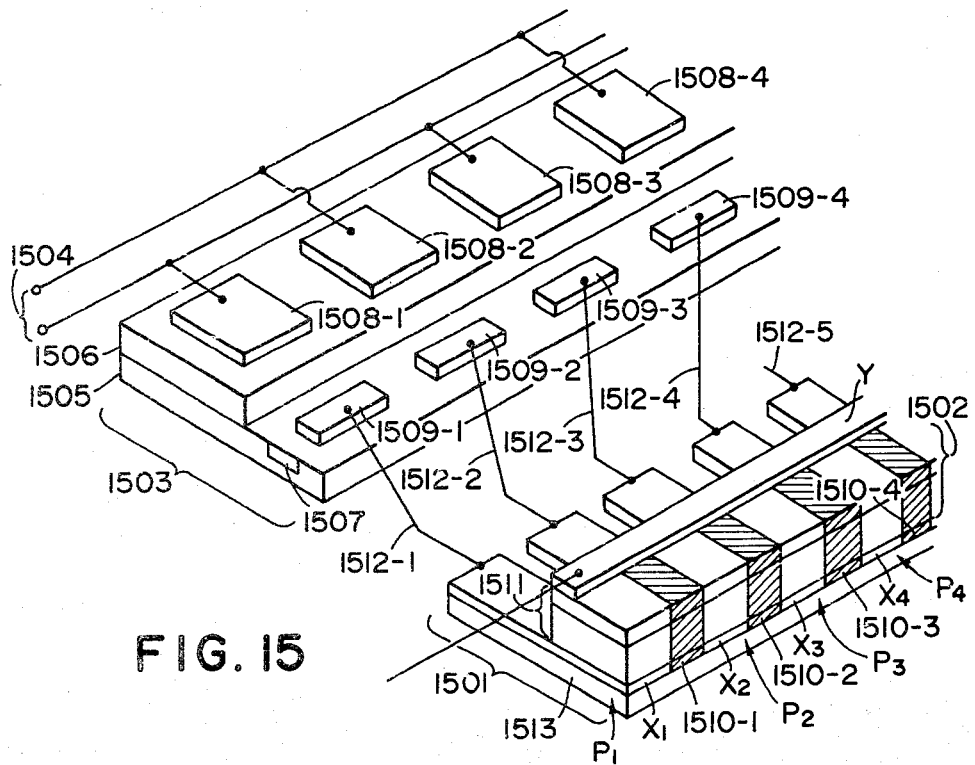
FIGS. 15, 16 and 17 are respectively schematic perspective views, partly in cross-section, showing the structures of the photoelectric conversion section and the time-sequential signal conversion section essential to the device according to the present invention.

FIG. 15 is a schematic perspective view showing a part of the construction of the photoelectric conversion type information processing device which is shown in block diagram in FIG. 2. In this information processing device, the time-sequential signal conversion section 1503 is constructed with CCDR. The CCDR is of such a construction that, for instance, an insulating layer 1506 made of $SiO_2$ is formed on one part of a p-type silicon layer 1505, and n numbers of transfer electrodes 1508 are independently and separately provided on this insulating layer 1506. An $n^+$ type silicon layer 1507 is formed with in the p-type silicon layer 1505, and n numbers of electrodes 1509 are provided on the $n^+$ type silicon layer 1507 in correspondence to each of the independent electrodes $(X_1, X_2, X_3, X_4 \ldots X_n)$ provided for each of the photoelectric conversion elements 1502 $(P_1, P_2, P_3, \ldots P_n)$ which constitute the single dimensional, elongated photoelectric conversion section 1501. The n numbers of the electrodes 1509 and n numbers of the independent electrodes $(X_1, X_2, \ldots X_n)$ are electrically connected through an electrically conductive wire 1512 in a one-to-one relationship, as shown in the drawing.

The photoelectric conversion elements 1502 $(P_1, P_2, P_3, \ldots P_n)$ are of such construction that the photoelectric conversion layer 1511 is provided between the independent electrodes $(X_1, X_2, X_3, X_4, \ldots X_n)$ and the common electrode (Y). The photoelectric conversion layer 1511 is made the photovoltaic layer wherein the p-n junction, for example, is formed. In this case, the common electrode (Y) is not necessary to be provided on the entire surface region of the photoelectric conversion layer 1511, but it can be provided on one surface part of the photoelectric conversion layer 1511 as shown in the drawing. Consequently, when the light beam is irradiated from the side of the common electrode (Y), no consideration needs be given to the loss of the irradiated light due to its absorption into the common electrode (Y). Further, the material for the common electrode (Y) needs not always be light-transmissive. As stated in the foregoing, when the photoelectric conversion layer 1511 is made photovoltaic, each photoelectric conversion layer 1511 should be electrically insulated by providing and electrically insulating portion 1510. A numeral 1513 refers to a substrate.

Figure 16:
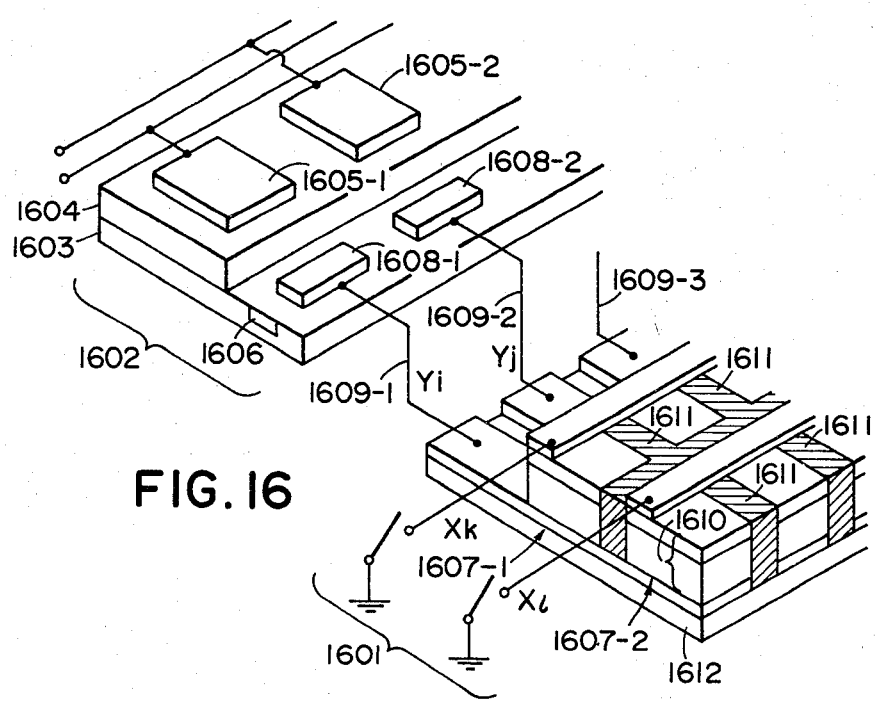

FIG. 16 is a schematic perspective view in partial cross-section showing a part of the construction of the two-dimensional photoelectric conversion section 1601 and the time-sequential signal conversion section 1602 in the photoelectric conversion type information processing device shown in FIG. 6. This FIG. 16 embodiment shows that the time-sequential signal conversion section 1602 is constructed with CCDR. CCDR which constitutes the time-sequential signal conversion section 1602 is in such a construction that, for instance, an insulating layer 1604 made of $SiO_2$ is formed on one part of a p-type silicon layer 1603, and n numbers of transfer electrodes 1605 are provided separately and independently on this insulating layer 1604. On the other hand, an $n^+$ type silicon layer 1606 is formed in the p-type silicon layer 1603, and n numbers of electrodes 1608 are provided on this $n^+$ type silicon layer 1606 in correspondence to the column electrodes ($Y_1 \ldots Y_i, Y_j \ldots Y_n$) provided for each of the photoelectric conversion elements 1607 constituting the two-dimensional photoelectric conversion section 1601. These n numbers of electrodes 1608 and n numbers of column electrodes ($Y_1 \ldots Y_i, Y_j \ldots Y_n$) are electrically connected through conductive wires 1609 in a one-to-one relationship, as shown in the drawing.

The photoelectric conversion element 1607 is of such construction that the photoelectric conversion layers 1610 are interposed between the column electrodes ($Y_1 \ldots Y_i, Y_j \ldots Y_n$) and the row electrodes ($X_1 \ldots X_k, X_1 \ldots X_m$). Each photoelectric conversion layer 1610 is made photovoltaic layer, in which the p-n junction, for example, is formed. In this case, the row electrodes ($X_1 \ldots X_k, X_1 \ldots X_m$) need not be provided on the entire surface region of the photoelectric conversion layer 1610, but they may be provided on one surface part thereof as shown in the drawing. Accordingly, when the row electrodes ($X_1 \ldots X_k, X_1 \ldots X_m$) are light-irradiated, no consideration is required to be taken as to loss of light due to its absorption into the electrodes. Further, the row electrodes need not always be made of light transmissive material. A reference numeral 1612 designates a substrate. As stated in the foregoing, when the photoelectric conversion layer 1610 is made photovoltaic, each of the photoelectric conversion layers 1610 should be electrically insulated by providing electrically insulative section 1611 between each layer.

Figure 17:
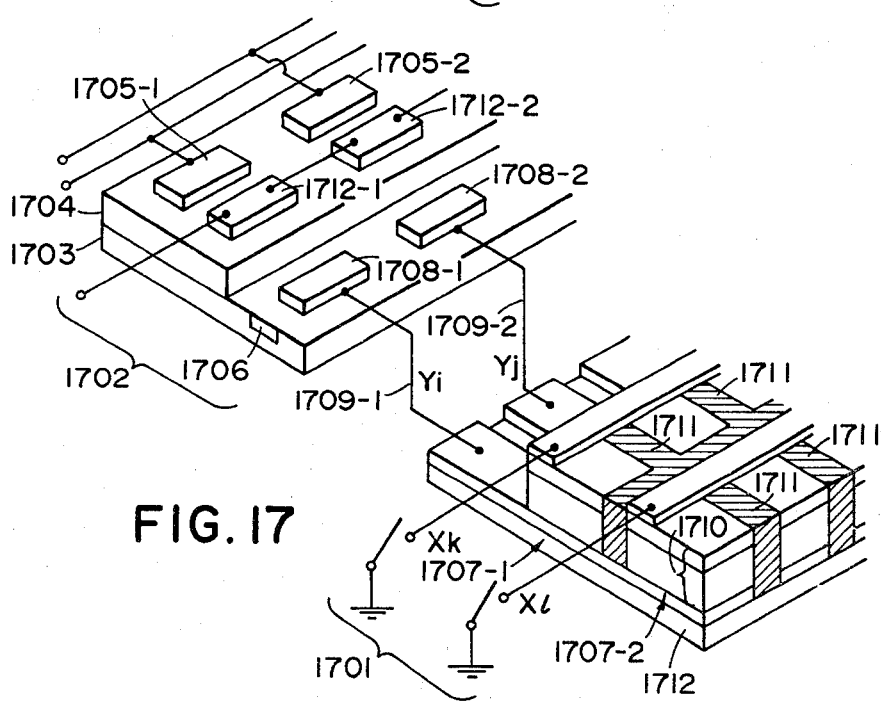

FIG. 17 is also a schematic perspective view, partly in cross-section, showing a part of the construction of the two-dimensional photoelectric conversion section 1701 and the time-sequential signal conversion section 1702 in the photoelectric conversion type information processing device shown in FIG. 6. The fundamental construction is not essentially different from that of FIG. 16. The point of difference in this embodiment from the FIG. 16 embodiment is that, while the FIG. 16 embodiment constructs the time-sequential signal conversion section 1602 with CCDR, in which the accumulation section and the transfer section are formed integrally, the CCDR in this FIG. 17 embodiment separately provides the accumulation section and the transfer section, and the accumulating electrodes 1712 are provided in a one-to-one relationship with respect to the transfer electrodes 1705. The other construction and functions are exactly same as those of the FIG. 16 embodiment. A reference numeral 1713 designates a substrate.

In order that the photoelectric conversion type information processing device according to the present invention is able to process color informations, too, there may be adopted various methods effectively utilized in the field of ordinary image processing technique such as, for example, a method of directly providing three color filter coatings of blue, green, and red on the light receiving surface of the photoelectric conversion section, each being formed separately and in mosaic fashion; a method of forming three color filter coating of blue, green and red on other substrate in a separate and mosaic fashion and then providing this substrate on the light receiving surface of the photoelectric conversion section using an adhesive agent, etc.; or a method, in which light irradiation is effected three times by changing the three color filters of blue, green and red at each time.

In the following, actual examples of the present invention will be explained as regards the manufacturing steps of CCDR as the photoelectric conversion section and the time-sequential signal conversion section.

EXAMPLE 1

(a) Manufacture of Single Dimensional, Elongated Photoelectric Conversion Section A glass substrate having a dimension of 10 mm×250 mm×2 mm was sufficiently washed with neutral detergent, ultrasonic wave, streaming water, pure water, a mixture of ethyl alcohol and potassium hydroxide, again pure water and ultrasonic wave, in the order as mentioned, followed by drying the same.

Onto this clean substrate, aluminum was evaporatively deposited to a thickness of 1 μm by the vacuum evaporation method with a degree of vacuum of $5 \times 10^{-6}$ Torr. After the evaporative deposition of aluminum, the aluminum-coated substrate was placed in a separate deposition chamber. Then, $SiH_4$ and $PH_3$ gases were introduced into this chamber with a degree of vacuum of $1 \times 10^{-5}$ Torr, after which the pressure within the deposition chamber was maintained at approximately 1 Torr. Subsequently, high frequency electric power of 13.56 MHz was supplied through an induction coil wound around the exterior of the deposition chamber to cause the glow discharge within the deposition chamber to thereby deposit the n-type a-Si (amorphous silicon) on the aluminum coating to a thickness of 1 μm. Next, feeding of $PH_3$ gas was stopped, and $B_2H_6$ gas was introduced into the deposition chamber. In this atmosphere of $SiH_4$ and $B_2H_6$ gases, deposition of the p-type a-Si was continued until it attained a thickness of 0.3 μm. The temperature of the substrate was maintained at 300° C. during the glow discharge deposition.

The substrate, on which the evaporated film of aluminum, the n-type a-Si film and the p-type a-Si film were formed, was taken outside the chamber by breaking the vacuum condition, followed by overall application of a photo-resist "OMR-83" (a trademark for the product of Tokyo Ohka Co., Japan). After application of the photo-resist, an image element pattern of the photo-resist was formed on the p-type a-Si through a mask having such predetermined image element pattern by the steps of light exposure with a mercury lamp and subsequent development of the pattern. Using an etching liquid (for a-Si etching: $HF/HNO_3 = 1/5$; for Al etching: $H_2PO_4/CH_3COOH/HNO_3/H_2O = 35/7/1/7$), a portion where no photo-resist was coated was etched to remove the p-type a-Si, the n-type a-Si, and aluminum films from the substrate along the image element pattern. After sufficient drying subsequent to the etching, an $SiO_2$ film was deposited thereon to a thickness of 3 μm by sputtering, thereby depositing the SiO₂ film on the photo-resist film and the etched portion between the image elements.

Figure 18:
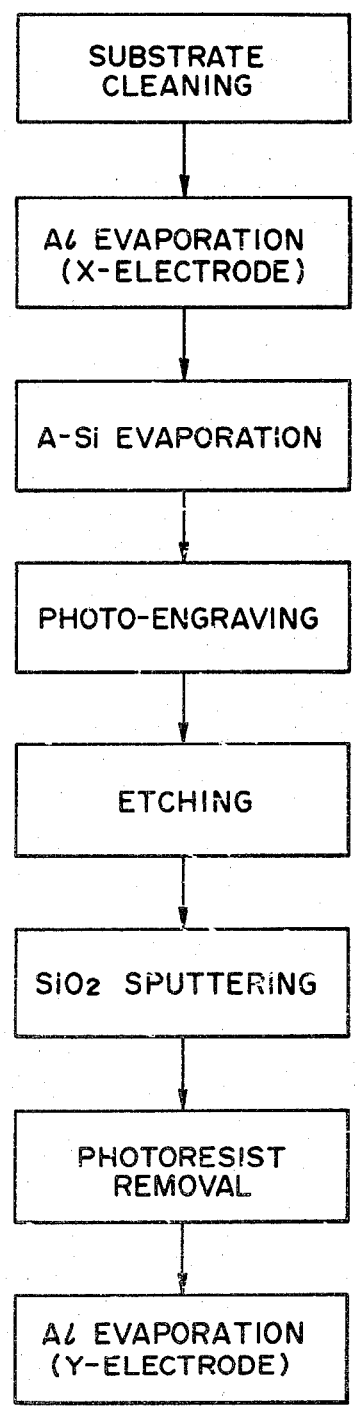
FIGS. 18 and 19 are respectively flow process charts for the manufacture of the device according to the present invention.

After deposition of the SiO₂ film, the vacuum condition was again broken and the substrate was taken out of the deposition chamber, and the photo-resist was removed in a peeling liquid. In this instance, the SiO₂ film remained as the insulative member between the image elements. Again, aluminum was evaporatively deposited to a thickness of 1 μm by the vacuum evaporating method through the aluminum electrode (X electrode), the n-type a-Si film, and the p-type a-Si film in the form of it crossing over these films, thereby forming Y electrode. Width of this aluminum film may be remarkably small in comparison with that in the X electrode. FIG. 18 shows the flow process chart of the above-described manufacturing steps.

b. Manufacture of CCDR

Figure 19:
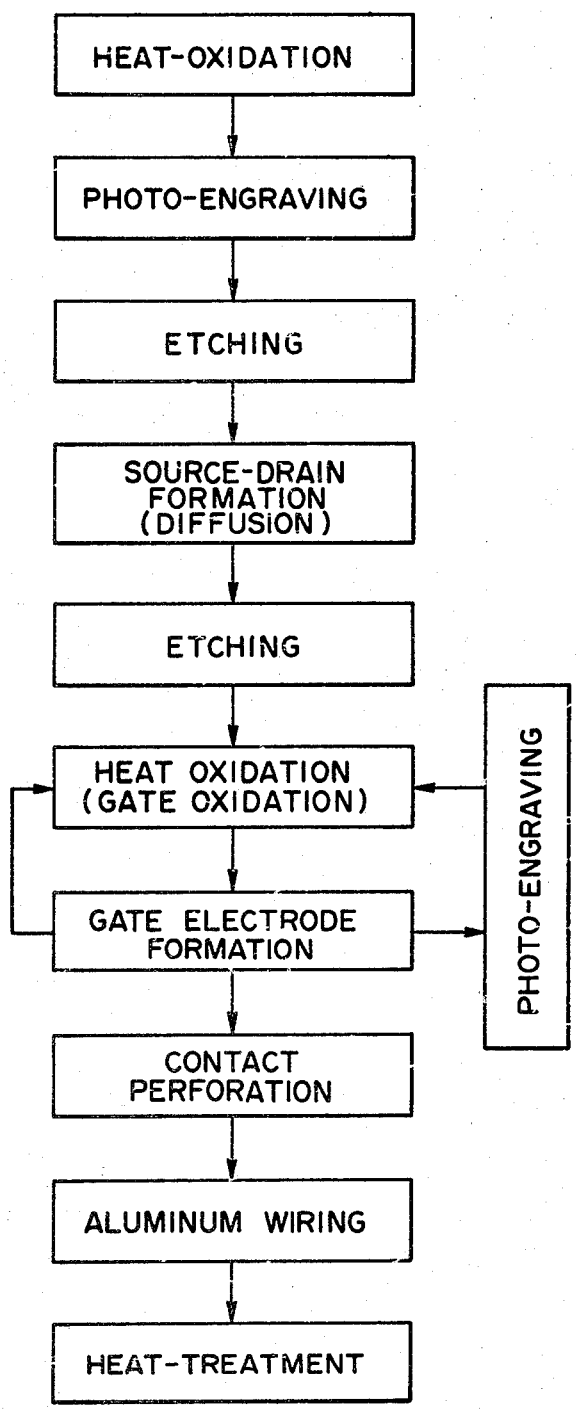

At first, an SiO₂ film having a thickness of 5,000 angstroms was subjected to thermal growth on a p-type silicon wafer (substrate) by heating the same. Subsequently, unnecessary portions of the abovementioned SiO₂ film on the substrate were removed by the photoengraving technique to form a plurality of sources and a single drain. Then, phosphorous was diffused in the substrate by heat-diffusion. After this, remainder of the SiO₂ film on the substrate was totally removed by the etching treatment. Again, an SiO₂ film having a film thickness of 2,000 angstroms was thermally grown on the substrate by heating, thereby forming a gate oxidated film. Following this, an aluminum gate electrode was formed by the vacuum evaporation method, the photoengraving technique, and the heat-oxidation treatment. Remaining process steps for forming the CCDR, i.e., perforation of the contact section, aluminum wiring, and heat-treatment, were carried out by an ordinary method, whereby the CCDR having a plurality of the sources, a single drain, and a transfer section could be obtained. FIG. 19 illustrate the flow process charge of the manufacturing steps.

Again, aluminum was evaporatively desposited on the substrate to a thickness of 1 μm by the vacuum evaporation method through the initially formed aluminum electrode (X electrode), the n-type a-Si film, and the p-type a-Si film in the form of it crossing over these films, thereby forming the Y electrode. Width of this aluminum deposited film was made smaller than that of the Y electrode.

After the photoelectric conversion section and the time sequential signal conversion section (CCDR in this embodiment) were manufactured in the above-described manner, the Y electrode of the photoelectric conversion section was grounded and each of the X electrodes thereof was connected in a one-to-one relationship with each of the sources in CCDR through a lead wire. The thus obtained combination of the two conversion sections was incorporated as an input device in the main body of a digital copier which adopts an ink-jet system as its output device, in a positional relationship as diagrammatically shown in FIG. 20, and reproduction of an image original in A4 size was conducted with this digital copier. A very clear reproduced image having high image resolution and high image quality could be obtained.

Figure 20:
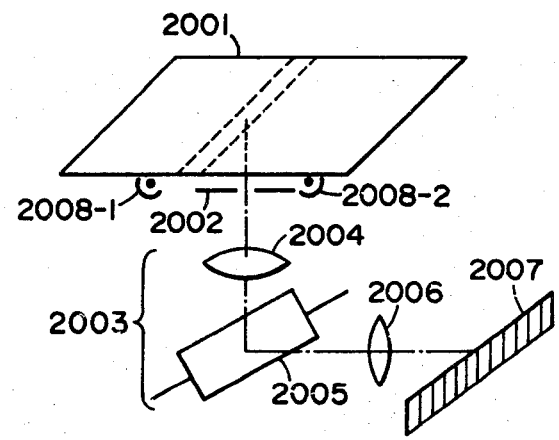
FIGS. 20 and 21 are respectively schematic explanatory views showing a construction of an image original reading section when the photoelectric conversion type information processing device according to the present invention is applied to the digital copier.

In FIG. 20, a reference numeral 2001 designates an image original, and a numeral 2007 refers to the light receiving surface of the photoelectric conversion section. Between the image original 2001 and the light receiving surface 2007, there are disposed a slit 2002 having a predetermined width and an optical system 2003 at their predetermined positions. Reference numerals 2008-1 and 2008-2 indicate light sources to irradiate the surface of the image original. The optical system 2003 consists of lens systems 2004, 2006 and a rotatory mirror 2005 interposed between the lens system 2004 and the lens system 2006. Scanning for reading of the image original 2001 can be performed over the entire region of the image original 2001 by relatively moving the image original 2001 and the optical system 2003 inclusive of the light sources 2008-1 and 2008-2. In this instance, movement of the optical system 2003 is meant by movement of any one of the elements constituting the optical system 2003.

EXAMPLE 2

(a) Manufacture of Two-Dimensional Photoelectric Conversion Section

In accordance with the process steps shown in the flow chart in FIG. 18, the photoelectric conversion section was manufactured in the following manner.

A glass substrate of 210 mm×300 mm×2 mm was sufficiently washed with neutral detergent, ultrasonic waves, streaming water, pure water, a mixture of ethyl alcohol and potassium hydroxide, again pure water and ultrasonic waves, in the order as mentioned, after which the substrate was dried.

Then, aluminum was evaporatively deposited onto this substrate to a film thickness of 1 μm by the vacuum evaporation method with a degree of vacuum of $5 \times 10^{-6}$ Torr. After deposition of aluminum film, SiH₄ and PH₃ gases were introduced into the deposition chamber and the pressure within the chamber was maintained at 1 Torr. Subsequently, glow discharge was caused in the deposition chamber by supplying high frequency electric power of 13.56 MHz through an induction coil wound around the exterior of the deposition chamber to thereby deposit the n-type a-Si on the deposited aluminum film to a thickness of 1 μm. After this, introduction of PH₃ gas into the deposition chamber was stopped, and B₂H₆ gas was introduced thereinto to successively conduct deposition of the p-type a-Si film to a thickness of 0.3 μm in the gas atmosphere of SiH₄ and P₂H₆. During this glow discharge deposition, the substrate was maintained at a temperature of 300° C.

The substrate, on which the evaporated film of aluminum, the n-type a-Si film and the p-type a-Si film were sequentially laminated, was taken outside the deposition chamber by breaking the vacuum condition. Onto this substrate, a photo-resist "OMR-83" (a trademark for the product of Tokyo Ohka Co., Japan) was applied, and then an image element pattern of the photo-resist was formed on the p-type a-Si film through a mask having such predetermined image element pattern by the steps of light exposure with a mercury lamp and subsequent development of the pattern.

Then, using the etching liquid mentioned in the previous Example 1, a portion where no photo-resist was coated was etched to remove the p-type a-Si, the n-type a-Si, and aluminum films from the substrate along the image element pattern.

After sufficient drying following the etching, an SiO₂ film was deposited thereon to a thickness of 3 μm by sputtering, thereby depositing the SiO₂ film on the photo-resist film and the etched portions between each of the image elements.

After deposition of the SiO₂ film, the vacuum condition was again broken and the substrate was taken out of the deposition chamber, and the photo-resist was removed in a peeling liquid. The SiO₂ film remained as the insulative member only between the image elements.

(b) Manufacture of CCDR

In accordance with the flow chart shown in FIG. 19, the CCDR was formed in the following manner.

At first, an SiO₂ film having a thickess of 5,000 angstroms was thermally grown on a p-type silicon wafer (substrate) by heating the same. Subsequently, unnecessary portions of the abovementioned SiO₂ film on the substrate were removed by the photo-engraving technique to form a plurality of sources and a single drain. Then, phosphorous was thermally diffused in the substrate. After this, remainder of the SiO₂ film on the substrate was totally removed be etching. Again, an SiO₂ film having a thickness of 2,000 angstroms was thermally grown on the substrate by heating the same, thereby forming a gate oxidated film. Following this, an aluminum gate electrode was formed by the vacuum evaporation method, the photo-engraving method, and the heat-oxidation treatment. Remaining process steps for forming this CCDR, i.e., perforation of the contact section, aluminum wiring, and heat-treatment, were carried out by an ordinary method, whereby the CCDR having a plurality of the sources, a single drain, and a transfer section could be formed.

After the photoelectric conversion section and the time-sequential signal conversion section (CCDR in this embodiment) were manufactured as described above, each of the X electrodes (row electrodes) of the photoelectric conversion section was connected to each terminal of the row selection signal generating section, and each of the Y electrodes (column electrodes) was connected with each of the source sections of the CCDR with a lead wire in a one-to-one relationship. Such combined unit was incorporated as an input device in the main body of a digital copier which adopts an ink-jet system as its output device, in a positional relationship as diagrammatically shown in FIG. 21, and reproduction of an image original in A4 size was conducted. A very clear reproduced image having high image resolution and high image quality could be obtained.

Figure 21:
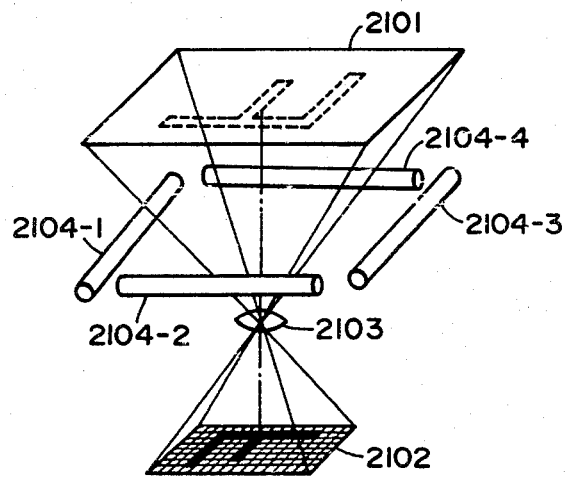

In FIG. 21, a reference numeral 2101 designates an image original, and 2102 refers to a light receiving surface of the photoelectric conversion section. Between the image original 2101 and the light receiving surface 2102, there is disposed an image forming optical system 2103 at a predetermined position. A numeral 2104 refers to light sources for irradiating the surface of the image original. The optical system 2103 is movably provided so that the image original may be focussed on the light receiving surface.

As for the illuminating system, since the image surface luminance around periphery of the image original lowers in accordance with the rule of $\cos^4\theta$ with respect to the image angle $\theta$, even if a projecting lens has no vignetting in general, the luminance around the peripheral surface of the image original 2101 may be made higher than the luminance at the center part of the image original surface so as to make uniform the image surface luminance on the light receiving surface. As one method for such correction, the light sources 2104 for illumination are arranged along the periphery of the image original surface 2101, as shown in FIG. 21.

What we claim is:

1. A photoelectric conversion type information processing device, comprising:

a single dimensional, elongated photoelectric conversion section having n numbers of photoelectric conversion elements arranged in an array on a substrate, each of said photoelectric conversion elements having a thin-film vapor-deposited photoelectric conversion layer, one electrode provided independently for each of said photoelectric conversion elements and another electrode provided common to said photoelectric conversion elements; and a time-sequential signal conversion section which, in response to a light signal input, introduces thereinto in parallel k numbers of signal outputs from said photoelectric conversion section, and which renders at least a part of said k numbers of signal outputs time-sequential, where $k \leq n$.

2. The information processing device as set forth in claim 1, wherein said single-dimensional, elongated photoelectric conversion section and said time-sequential signal conversion section are provided separately and independently on the substrate.

3. The information processing device as set forth in claim 1, wherein said single-dimensional, elongated photoelectric conversion section is provided on one surface side of the substrate, and said time-sequential signal conversion section is provided on the other surface side thereof.

4. The information processing device as set forth in claim 1, wherein each of said photoelectric conversion elements is of a photovoltaic type with a p-n junction being formed in the photoelectric conversion layer.

5. The information processing device as set forth in claim 1, wherein each of said photoelectric conversion elements is of the photovoltaic type, in which said photoelectric conversion layer forms the Schottky barrier with said common electrode and said independent electrode, and forms the ohmic contact with a third electrode.

6. The information processing device as set forth in claim 1, wherein said photoelectric conversion layer is photoconductive, and an insulating layer is provided on said independent electrode, and a third electrode on said insulating layer.

7. The information processing device as set forth in claim 1, wherein said photoelectric conversion layer is photoconductive, and an insulating layer is provided in parallel with said photoelectric conversion layer on the surface side of said independent electrode where said photoelectric conversion layer is provided.

8. The information processing device as set forth in claim 1, wherein a resistance layer is provided in parallel with said photoelectric conversion layer on the surface side of said independent electrode where said photoelectric conversion layer is provided.

9. The information processing device as set forth in claim 1, wherein said photoelectric conversion layer is photoconductive, said independent electrode and common electrode are provided on one and same surface side, the insulating layer is provided on the surface side opposite to that of said independent electrode where said photoelectric conversion layer is provided, and a third electrode is provided on said insulating layer.

10. The information processing device as set forth in claim 1, wherein said photoelectric conversion layer is photoconductive, said independent electrode and said common electrode are provided on the same surface side, and a resistance layer is provided through said independent electrode.

11. The information processing device as set forth in claim 1, wherein said photoelectric conversion layer is composed at least in part of amorphous silicon.

12. A photoelectric conversion type information processing device comprising:
 a two-dimensional elongated photoelectric conversion section having a group of m x n numbers of photoelectric conversion elements arranged in a matrix form consisting of m rows and n columns, each of said photoelectric conversion elements having a thin-film vapor-deposited photoelectric conversion layer one electrode common to the rows and another electrode common to the columns of said photoelectric conversion section;
 a row-selection signal generating section which generates a signal output as the result of selection of any row in said two dimensional photoelectric conversion section; and
 a time-sequential signal conversion section which, in response to a light signal input, introduces thereinto in parallel k numbers of signal outputs from each of said n numbers of photoelectric conversion elements constituting the rows to be selected, and which renders at least a part of these k numbers of signals time-sequential, where $k \leq n$.

13. The information processing device as set forth in claim 12, wherein said two-dimensional photoelectric conversion section and said time-sequential signal conversion section are provided separately and independently on a substrate.

14. The information processing device as set forth in claim 12, wherein said two-dimensional photoelectric conversion section is provided on one surface side of one and same substrate, and said row-selection signal generating section and said time-sequential signal conversion section are provided on the other surface side thereof.

15. The information processing device as set forth in claim 12, wherein said photoelectric conversion element is of a photovoltaic type with a p-n junction being formed in said photoelectric conversion layer.

16. The information processing device as set forth in claim 12, wherein said photoelectric conversion element is of a photovoltaic type, in which said photoelectric conversion layer forms the Schottky barrier with any one of said X and Y electrodes.

17. The information processing device as set forth in claim 12, wherein said photoelectric conversion layer comprises amorphous silicon.

18. The photoelectric conversion type information processing device of claims 1 or 12, wherein said photoelectric conversion elements having a thin-film vapor-deposited photoelectric conversion layer comprise amorphous silicon and are fabricated by electric discharge in a deposition chamber under reduced pressure into which a material containing silicon as a constituent element is introduced.

19. The information processing device of claim 1 or 12, wherein said time-sequential signal conversion section is constructed with a charge transfer device.

20. The information processing device of claim 19, wherein said charge transfer device is a charge coupled device.

21. The information processing device of claim 1 or 12, wherein said time-sequential signal conversion section is constructed with a shift register.

22. The information processing device of claim 1 or 12, wherein said time-sequential signal conversion section is constructed with a transistor array.

23. The information processing device of claim 1 or 12, wherein said time-sequential section consists of a signal-accumulating section and a signal-transferring section.

24. The information processing device of claim 1 or 12, wherein said photoelectric conversion section includes color filter means.

25. The information processing device of claim 1 or 12, wherein said photoelectric conversion section includes filter coatings of blue, green, and red provided on the light receiving surface thereof.

26. The information processing device of claim 1 or 12, wherein each of said photoelectric conversion elements is provided with a functional element.

27. The information processing device of claim 26, wherein said functional element is a resistor.

28. The information processing device of claim 26, wherein said functional element is a capacitor.

29. The information processing device of claim 11 or 17, wherein said amorphous silicon is doped with B.

30. The information processing device of claim 11 or 17, wherein said amorphous silicon is doped with P.

* * * * *

UNITED STATES PATENT AND TRADEMARK OFFICE
CERTIFICATE OF CORRECTION

PATENT NO. : 4,376,888

DATED : March 15, 1983

INVENTOR(S) : TADAJI FUKUDA, ET AL.

It is certified that error appears in the above-identified patent and that said Letters Patent is hereby corrected as shown below:

```
Column 4, line 55, "of may" should read --or may--.

Column 5, line 1, "nuneral" should read --numeral--;
          line 26, "an" should read --any--;
          line 64, "in parallel introduced" should read
                   --introduced in parallel--.

Column 6, line 18, "acrues" should read --accrues--;
          lines 29 - 30, "in parallel thereinto" should read
                   --thereinto in parallel--;
          line 37, "in parallel introduced" should read
                   --introduced in parallel--.

Column 9, line 34, "Shottky" should read --Schottky--;
          line 55, "know" should read --known--.

Column 10, line 34,35, "n+$type$" should read --n+type--.

Column 12, line 33, "with in" should read --within--;
           line 61, "needs not" should read --need not--.

Column 13, line 62, "exactly same" should read --exactly the
                    same--.

Column 14, line 6, "coating" should read --coatings--.
```

UNITED STATES PATENT AND TRADEMARK OFFICE
CERTIFICATE OF CORRECTION

PATENT NO. : 4,376,888

DATED : March 15, 1983

INVENTOR(S) : TADAJI FUKUDA, ET AL.

It is certified that error appears in the above-identified patent and that said Letters Patent is hereby corrected as shown below:

Column 15, line 40, "illustrate" should read --illustrates--;
line 42, "desposited" should read --deposited--.

Column 17, line 20, "be" should read --by--.

Column 18, line 64, Claim 9, "one and same" should read --one and the same--.

Column 19, line 40, "Claim 14, "one and same" should read --one and the same--.

Signed and Sealed this

Third Day of January 1984

[SEAL]

Attest:

GERALD J. MOSSINGHOFF

*Attesting Officer*   *Commissioner of Patents and Trademarks*